United States Patent
Wang et al.

(10) Patent No.: US 7,387,973 B2
(45) Date of Patent: Jun. 17, 2008

(54) METHOD FOR IMPROVING LOW-K DIELECTRICS BY SUPERCRITICAL FLUID TREATMENTS

(75) Inventors: Ching-Ya Wang, Taipei (TW); Joshua Tseng, Hsinchu County (TW); Henry Lo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/956,640

(22) Filed: Sep. 30, 2004

(65) Prior Publication Data

US 2006/0073697 A1   Apr. 6, 2006

(51) Int. Cl.
*H01L 21/31* (2006.01)
*H01L 21/469* (2006.01)

(52) U.S. Cl. ............... 438/778; 438/780; 438/787; 438/789; 438/623

(58) Field of Classification Search ............ 438/761, 438/763, 778, 782, 789, 790, 793, 7
See application file for complete search history.

(56) References Cited

U.S. PATENT DOCUMENTS

| | | | |
|---|---|---|---|
| 6,486,078 B1 * | 11/2002 | Rangarajan et al. | 438/778 |
| 6,770,572 B1 * | 8/2004 | Wu et al. | 438/778 |
| 6,800,142 B1 * | 10/2004 | Tipton et al. | 134/26 |
| 6,875,709 B2 * | 4/2005 | Lin et al. | 438/781 |
| 2002/0001929 A1 * | 1/2002 | Biberger et al. | 438/584 |
| 2003/0047195 A1 * | 3/2003 | DeYoung et al. | 134/12 |
| 2003/0190818 A1 * | 10/2003 | Carbonell et al. | 438/760 |
| 2004/0048960 A1 * | 3/2004 | Peterson et al. | 524/261 |
| 2004/0096672 A1 * | 5/2004 | Lukas et al. | 428/446 |
| 2004/0121269 A1 * | 6/2004 | Liu et al. | 430/329 |
| 2004/0142564 A1 * | 7/2004 | Mullee et al. | 438/689 |
| 2004/0175958 A1 * | 9/2004 | Lin et al. | 438/778 |
| 2005/0095828 A1 * | 5/2005 | Schmidt et al. | 438/584 |
| 2005/0095840 A1 * | 5/2005 | Bhanap et al. | 438/623 |
| 2005/0106762 A1 * | 5/2005 | Chakrapani et al. | 438/4 |
| 2006/0057855 A1 * | 3/2006 | Ramos et al. | 438/710 |

* cited by examiner

*Primary Examiner*—Steven Loke
*Assistant Examiner*—David Goodwin
(74) *Attorney, Agent, or Firm*—Tung & Associates

(57) ABSTRACT

A method for treating an inter-metal dielectric (IMD) layer to improve a mechanical strength and/or repair plasma etching damage including providing a low-K silicon oxide containing dielectric insulating layer; and carrying out a super critical fluid treatment of the low-K dielectric insulating layer including supercritical $CO_2$ and a solvent including a silicon bond forming substituent having a bonding energy greater than a Si—H to replace at least a portion of the Si—H bonds with the silicon bond forming substituent.

30 Claims, 4 Drawing Sheets

US 7,387,973 B2

METHOD FOR IMPROVING LOW-K DIELECTRICS BY SUPERCRITICAL FLUID TREATMENTS

FIELD OF THE INVENTION

This invention generally relates to integrated circuit manufacturing of multi-layered semiconductor devices and more particularly to a method for treating silicon oxide based low-K dielectric insulating layers including dielectric and mechanical properties using supercritical fluid treatments.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and low capacitance (e.g., low dielectric constant) interconnect properties.

In particular, in forming multi-level wiring in forming a semiconductor device, the formation of wiring interconnects requires several different steps including etching, ashing and wet cleaning. For example in the formation a dual damascene at least two separate etching and ashing steps are required. For example, silicon oxide based low-K dielectric insulating layers have exhibited a tendency to interact with oxygen containing plasmas in the ashing and dry etching steps to contaminate and detrimentally affect the low-K dielectric insulating layers.

Subsequent processes in the prior art including separate wet cleaning steps to remove contaminants such as fluorine from the surface and baking steps to remove adsorbed water from the low-K dielectric insulating layer have been required to improve degraded dielectric constants caused by plasma processes. In addition, other etching species can react with the low-K dielectric insulating layer contaminating it as well as making it more susceptible to moisture absorption during subsequent processing steps.

Approaches in the prior art to overcome moisture absorption and contamination of low-K silicon oxide based dielectric insulating layers have included wet cleaning processes followed by time-consuming baking processes to drive the absorbed moisture out of the low-K dielectric insulating layer. However, baking the dielectric insulating layer does not repair plasma processing damage such as the formation of dangling or coordinatively unsaturated silicon bonds or silanol bonds formed by interaction of the dielectric insulating layer with plasma species. Plasma treatments to repair plasma damage have met with limited success due to the tendency to form additional plasma damage to the dielectric insulating layer, as well as any repair being limited to very near surface regions.

There is therefore a need in the semiconductor processing art to develop a silicon oxide based low-K dielectric insulating layer treatment to repair plasma processing damage.

It is therefore an object of the invention to provide a silicon oxide based low-K dielectric insulating layer treatment to repair plasma processing damage, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for treating an inter-metal dielectric (IMD) layer to improve a mechanical strength and/or repair plasma etching damage.

In a first embodiment, the method includes providing a low-K silicon oxide containing dielectric insulating layer; and carrying out a super critical fluid treatment of the low-K dielectric insulating layer including supercritical $CO_2$ and a solvent including a silicon bond forming substituent to replace at least a portion of the Si—H, Si—F or dangling bonds with the silicon bond forming substituent.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

While the method of the present invention is explained with exemplary reference to the formation of a damascene structure, it will be appreciated that the method is generally applicable to the treatment of silicon dioxide containing dielectric insulating layers to either repair damage caused by processing steps including plasma assisted processes and wet cleaning processes as well as treating a dielectric insulating layer to increase a mechanical strength.

Figure 1A:
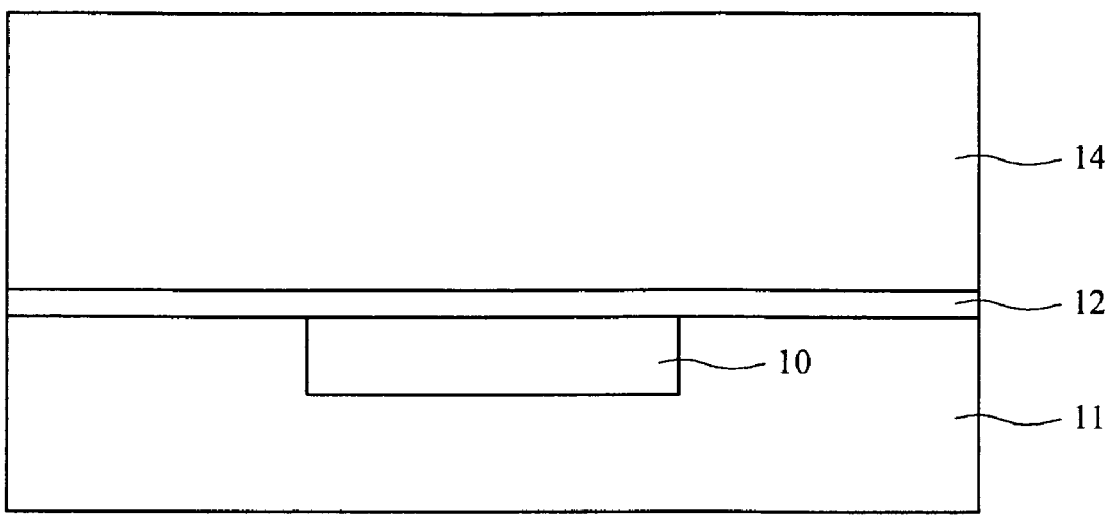
FIGS. 1A-1E are exemplary cross sectional views of a dual damascene structure stages in manufacturing process including the method according to an embodiment of the present invention.

For example, in an exemplary embodiment, referring to FIG. 1A, is shown a cross sectional view of a portion of a multi-level semiconductor device at stages in a damascene manufacturing process. Referring to FIG. 1A is shown a conductive region 10, for example, copper, formed in a dielectric insulating layer 11 having an overlying first etch stop layer 12, for example, silicon nitride (e.g., SiN), silicon oxynitride (e.g., SiON), silicon carbide (SiC), oxygen doped silicon carbide (e.g., SiOC), or nitrogen doped silicon carbide (e.g., SiCN). First etch stop layer 12 is, for example, formed by a conventional chemical vapor deposition (CVD) process including low pressure CVD (LPCVD) or plasma enhanced CVD (PECVD) process at a thickness of about 300 Angstroms to about 700 Angstroms.

Still referring to FIG. 1A, formed over (on) etching stop layer 12 is formed a dielectric insulating layer 14, also referred to as an inter-metal dielectric (IMD) layer preferably formed including a low-K (low dielectric constant) silicon oxide based material. For example, preferably the IMD layer is formed of a porous silicon oxide material including an interconnecting porous structure such as that formed by PECVD deposited carbon doped silicon oxide or organo-silicate glass (OSG). In addition, the dielectric insulating layer may be formed of inorganic or organic spin-on dielectrics (SOD) such as silsesquioxanes including methyl silsesquioxane formed by conventional spin-on processes. Preferably the low-K IMD layer 14 is formed with a dielectric constant of less than about 3.0, more preferably less than about 2.8. Typically, the IMD layer is formed having a thickness of about 3000 to about 7000 Angstroms.

Still referring to FIG. 1A, following deposition of the IMD layer 14, an optional first supercritical fluid treatment including an carbon dioxide ($CO_2$) containing medium and a methoxy containing co-solvent (e.g., $R-OCH_3$) is carried out at conventional supercritical fluid temperatures and pressures. For example R is an organic substituent including for example, an alkyl, hydroxyalkyl, phenyl, alkylphenyl, hydroxyalkylphenyl, alkanol, or amine group. The methoxy containing co-solvent is preferably present in the supercritical fluid at from about 5 weight percent to about 50 weight percent with respect to a total weight of a supercritical fluid. It will be appreciated that the supercritical fluid may include additional co-solvents and other additives such as surfactants.

The supercritical fluid treatment is carried out at conventional temperatures and pressures above a critical point to form a supercritical fluid (medium). For example, a supercritical fluid including $CO_2$ and the methoxy containing solvent is heated from about 25° C. to about 85° C. at a pressure from about 1000 psig to about 8000 psig to form a supercritical medium (fluid). More preferably, the supercritical $CO_2$ containing medium is formed by heating the $CO_2$ at a temperature from about 30° C. to about 70° C. at a pressure of about 2500 psig to about 4000 psig. For example, the supercritical $CO_2$ containing medium is formed to have a viscosity on the order of $10^{-2}$ to $10^{-4}$ poise and a density of about 600 to about 800 $kg/m^3$. Methods of forming supercritical fluids are known in the art including supercritical reactors having means for controlling pressure and temperature. For example, the $CO_2$ may be added to the reactor chamber in liquid form with selected additives and solvents or co-solvents added to the liquid $CO_2$ before or after the liquid $CO_2$ is introduced into the reactor. The treatment may be carried out for varying time periods, for example from about 2 minutes to about 45 minutes depending on the composition and prior processes the dielectric insulating layer has been subjected to.

It has been unexpectedly found that the supercritical fluid treatment according to preferred embodiments has the effect of forming an increased density of $Si-OCH_3$ bonds in the IMD layer, thereby increasing a mechanical strength of the IMD layer and repairing dangling bonds to form $Si-OCH_3$ bonds. In addition, it has been found that $Si-OCH_3$ bonds having a relatively stronger bonding energy of about 95.51 kcal/mole form during the supercritical fluid treatment to replace relatively weaker bonds such as Si—H having a bond energy of about 15.58 kcal/mole. Thus, the mechanical strength of the IMD layer is increased. In addition, the supercritical fluid treatment allows penetration into an IMD layer having an interconnecting porous structure thereby allowing the $SiOCH_3$ bond substitution/formation reaction to take place in the interior of the IMD layer, the extent of penetration dependent on the treatment temperature, time, the porous structure, and the viscosity of the supercritical fluid medium. Moreover, by increasing a mechanical strength of at least a surface portion of the IMD layer (e.g., non-porous IMD layer) according to the first supercritical fluid treatment, adhesion of overlying deposited layers such as etch stop and barrier layers is increased.

Figure 1B:
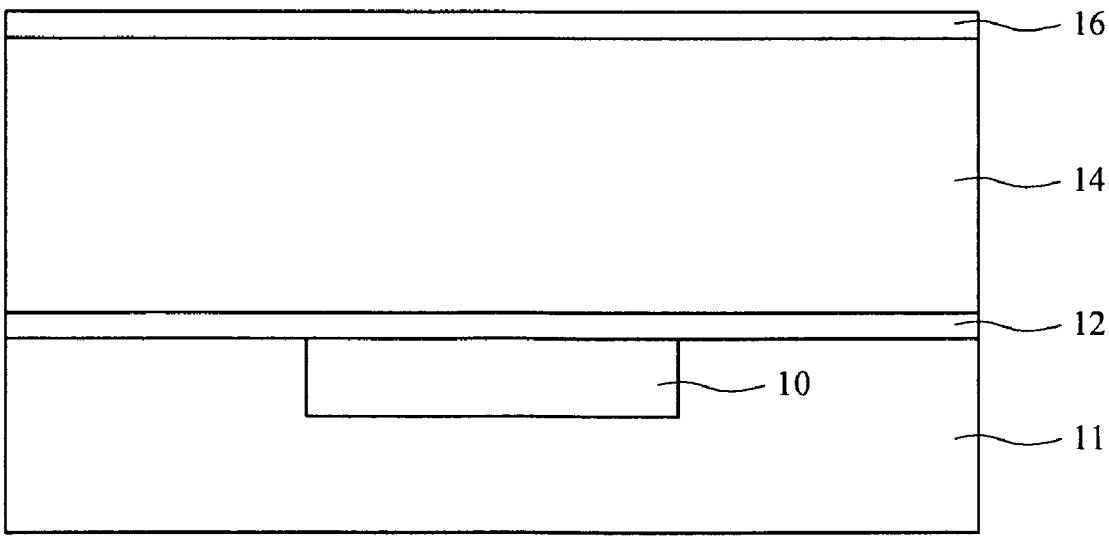

Referring to FIG. 1B, a second etch stop/BARC layer 16 is then formed over the IMD layer 14 following the optional first supercritical fluid treatment. For example, the etch stop/BARC layer may be formed of silicon nitride, silicon oxynitride, silicon carbide, oxygen doped silicon carbide, or combinations thereof.

Figure 1C:
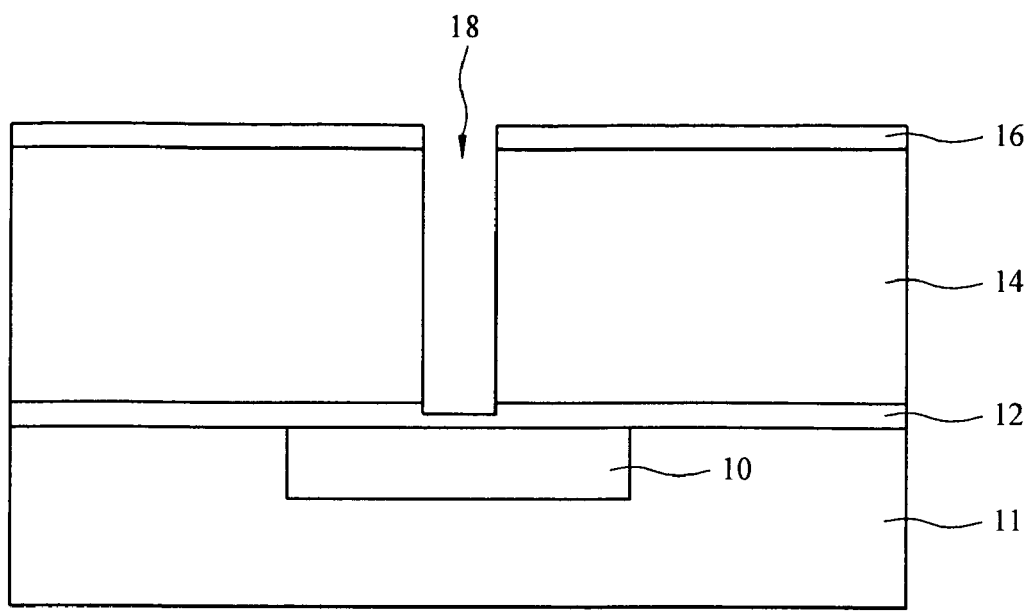

Referring to FIG. 1C, a damascene opening such as a via is then formed by a conventional photolithographic patterning and plasma assisted etching process including a fluorocarbons etching chemistry to form via opening 18. Following the plasma etching process, an oxygen ashing process may then be carried out to strip the resist layer. Following the etching and ashing processes, the exposed portion of the IMD layer e.g., via opening 18 is subjected to the supercritical fluid treatment process a second time according to the same preferred embodiments outlined for the first supercritical fluid treatment. Optionally, the via opening 18 may be formed to expose the underlying conductive e.g., copper region 10. In this case, a copper corrosion inhibitor may be added to the supercritical fluid medium, for example such as benzotriazole (BTA) and mercaptobenzothiazole (MBT) at less than about 1 weight percent with respect to the supercritical fluid total weight to protect the exposed copper from oxidation and corrosion in subsequent processes.

For example, it has also been found that plasma etching chemistry contaminants including fluorine and nitrogen form bonds with silicon near the surface of the IMD layer exposed to plasma etching. For example C—F bonds and Si—F bonds may form at the surface and near surface region of the via opening 18. It has been found that Si—F bonds have the effect of making the IMD layer surface hydrophilic, leading to the enhanced absorption of moisture in subsequent wet cleaning steps and electro-chemical deposition (ECD), e.g., ECD copper deposition. Advantageously, the supercritical fluid treatment carried out following the etching and oxygen ashing steps has the effect of repairing etching and ashing damage including dangling bonds of the exposed portion of the IMD layer (e.g., opening 18), as well as replacing undesirable contaminant bonds such as C—F and Si—F bonds with $Si-OCH_3$ (methoxy) bonds thereby repairing, mechanically strengthening, removing contaminants and restoring a hydrophobicity to the exposed portion of IMD layer. Thus, a dielectric constant is decreased to approach pre-plasma process levels and moisture absorption is reduced. Moreover, adhesion of a subsequently deposited layer such as a barrier layer will be enhanced. It will be appreciated that conventional processes are then carried out to complete the formation of the metal e.g., copper single or dual damascene such as barrier layer deposition, seed layer deposition and metal deposition such as a copper ECD process to form a single or dual damascene as shown below.

Figure 1D:
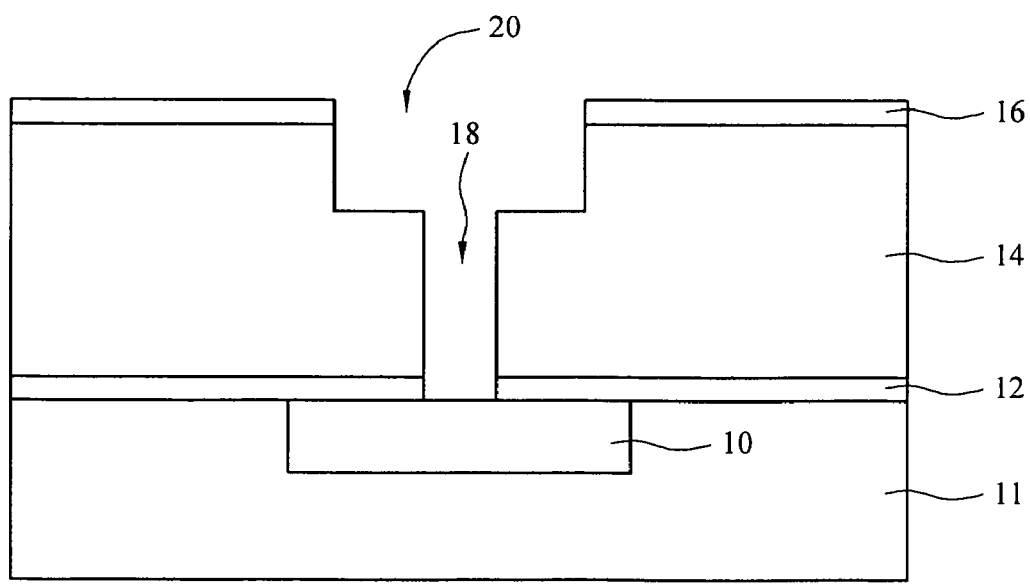

Referring to FIG. 1D, a dual damascene structure is shown including carrying out further embodiments of the present invention. For example, a conventional photolithographic patterning process is carried to form a trench line etching pattern over the via opening 18, followed by a conventional etching process to form trench opening 20. It will be appreciated that a resinous material (not shown) may be optionally deposited within the via opening 18 to at least partially fill it prior to forming the trench opening 20. Following formation of the trench opening 20 and removal of photoresist and resinous material by conventional ashing processes, the supercritical fluid treatment is carried out a third time according to preferred embodiments prior to barrier layer formation to form methoxy ($OCH_3$) substituted silicon bonds (e.g., $Si-(OCH_3)_x$ in the same manner as explained above. It will be appreciated that in forming a dual damascene, the second and third super critical processes may be combined in a single process, e.g., carrying out only the third supercritical fluid treatment following formation of the trench portion of the dual damascene opening.

Figure 1E:
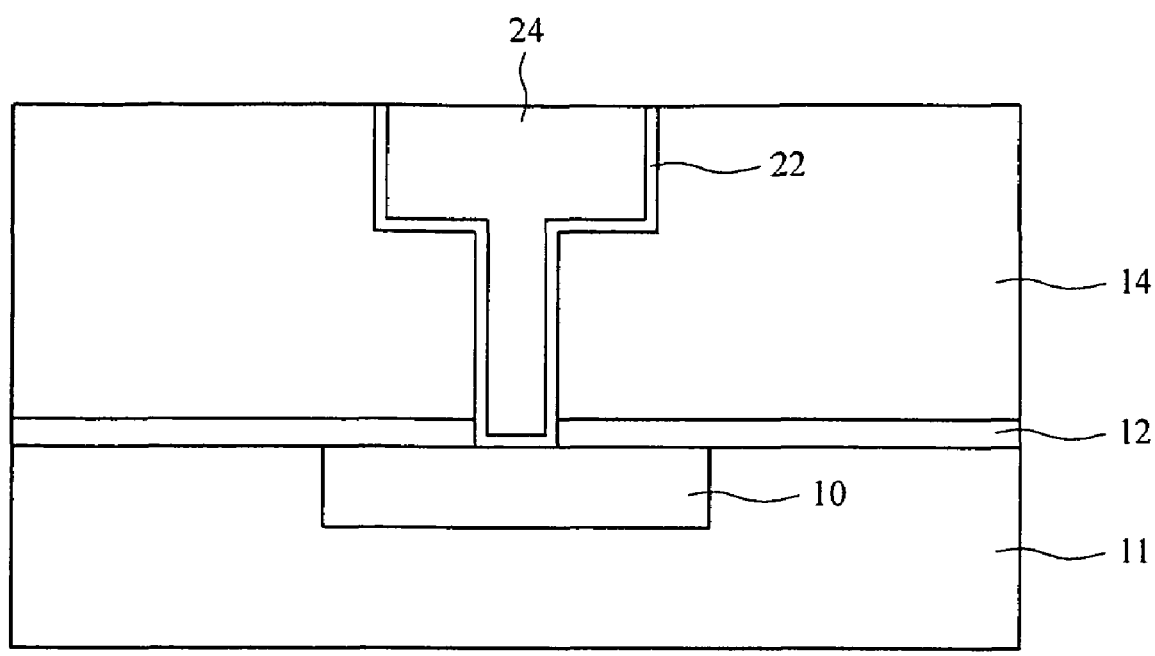

Referring to FIG. 1E, conventional processes are then carried out to complete the formation of the dual damascene including forming a barrier layer 22, e.g., TaN, to line the dual damascene opening, backfilling the opening with copper layer 24 by an electro-chemical deposition (ECD) process, and performing a CMP planarization process to expose the IMD layer 14 surface. It will be appreciated that a fourth supercritical fluid treatment may optionally be carried out according to preferred embodiments to treat the exposed IMD layer 14 surface prior to subsequent deposition of an etch stop layer (not shown) similar to formation of etch stop layer 12 to begin the formation of the next level of wiring in a multi-level semiconductor device. In the fourth supercritical fluid treatment, a copper corrosion inhibitor may be added to the supercritical fluid precursor medium as explained above with respect to the first supercritical fluid treatment to protect the exposed portion of the copper damascene from oxidation and corrosion.

Thus, according to the present invention, a supercritical fluid treatment for treating exposed portions of a silicon oxide based low-K IMD layer has been presented that has the advantageous effect of increasing a mechanical strength of the IMD layer by including a co-solvent in the supercritical treatment process capable of forming bonds with increased strength (bonding energy). For example, preferably the solvent includes alkoxy substituents, preferably a methoxy (OCH3) substituent. The supercritical fluid treatment has the additional beneficial effect of replacing contaminant silicon bonding species such as fluorine and nitrogen to decrease the IMD layer hydrophilicity (increased hydrophobicity) and improve (decrease) a dielectric constant. The supercritical fluid treatment of the IMD layer may be carried out prior to overlying material layer deposition processes and/or following plasma etching processes to repair plasma etching damage, strengthen the mechanical properties of the IMD layer and improve adhesion of overlying deposited material layers. By carrying out the supercritical fluid treatments according to preferred embodiments in a single or dual damascene formation process, the quality of wiring interconnects including device performance and reliability of a completed semiconductor device is improved including improved material layer adhesion and resistance to cracking and peeling.

Figure 2:
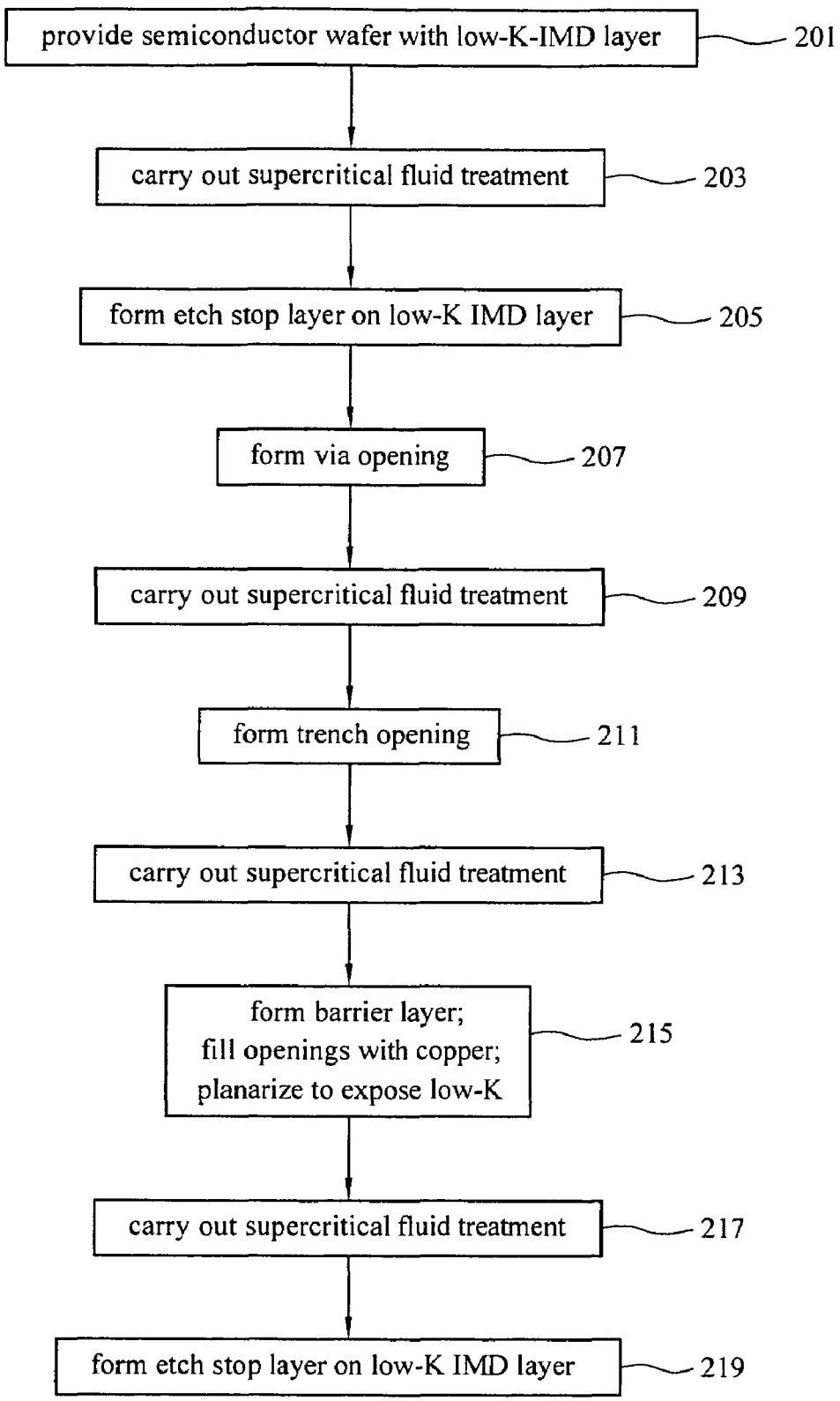
FIG. 2 is a process flow diagram including several embodiments of the method of the present invention.

Referring to FIG. 2 is shown a process flow diagram including several embodiments of the present invention. In process 201, a semiconductor process wafer comprising a low-K IMD layer is provided. In process 203, a supercritical treatment is optionally carried according to preferred embodiments. In process 205, an etch stop layer is formed on the low-K IMD layer. In process 207, a via opening is formed through the IMD layer thickness. In process 209, the supercritical fluid treatment is carried out a second time according to preferred embodiments. In process 211, a trench opening formed in the IMD layer overlying and encompassing the via opening. In process 213, the supercritical fluid treatment is carried out a third time according to preferred embodiments. In process 215, a barrier layer is formed and the opening backfilled with copper followed planarization to expose the low-K IMD layer surface. In process 217, a supercritical fluid treatment is optionally carried out a fourth time according to preferred embodiments to treat the exposed IMD layer surface. In process 219, an etch stop layer is formed on the IMD layer surface.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for treating a low-K dielectric layer comprising the steps of: providing a low-K silicon oxide containing dielectric insulating layer; and carrying out a super critical fluid treatment of the low-K dielectric insulating layer comprising supercritical $CO_2$ and a co-solvent, said co-solvent comprising an alkoxy ($O-R_1$) substituent in the form of $R-O-R_1$ where R is an organic group different from $R_1$, said alkoxy substituent forming Si-alkoxy (Si—$O-R_1$) bonds in the low-K silicon oxide containing dielectric insulating layer; wherein said super critical fluid treatment further comprises adding a copper corrosion inhibitor.

2. The method of claim 1, wherein the alkoxy substituent is a methoxy (O—CH3) group.

3. The method of claim 1, wherein R is selected from the group consisting of alkyls, hydroxyalkyls, phenyls, alkylphenyls, hydroxyalkylphenyls, alkanols, and amines.

4. The method of claim 1, wherein the low-K dielectric insulating layer comprises an interconnecting porous structure.

5. The method of claim 1, wherein the low-K dielectric insulating layer is selected from the group consisting of carbon doped silicon oxide, organo-silicate glass, and spin-on dielectrics.

6. The method of claim 1, further comprising the step of forming an etch stop layer on the low-K dielectric insulating layer following the supercritical fluid treatment.

7. The method of claim 1, wherein the low-K dielectric insulating layer comprises a plasma etched opening.

8. The method of claim 7, wherein the plasma etched opening is selected from the group consisting of a via and a dual damascene opening.

9. The method of claim 7, wherein the opening is exposed to a plasma ashing process prior to the supercritical fluid treatment.

10. The method of claim 1, wherein the low-K dielectric insulating layer comprises an exposed copper portion.

11. The method of claim 1, wherein the copper corrosion inhibitor is selected from the group consisting of benzotriazole (BTA) and mercaptobenzothiazole (MBT).

12. The method of claim 1, further comprising the steps of:
forming an etch stop layer on the on the low-K silicon oxide containing dielectric insulating layer;
forming a plasma etched opening in the low-K silicon oxide containing dielectric insulating layer; and,
carrying out the supercritical fluid treatment a second time.

13. The method of claim 12, further comprising the steps of:
forming a barrier layer to line the plasma etched opening;
backfilling the plasma etched opening with copper according;
carrying out a CMP process to expose the low-K silicon oxide containing dielectric insulating layer; and,
carrying out the supercritical fluid treatment a third time.

14. A method for treating an inter-metal dielectric (IMD) layer to improve a mechanical strength and/or repair plasma etching damage comprising the steps of: providing a silicon oxide containing low-K IMD layer; and, carrying out a supercritical fluid treatment comprising supercritical $CO_2$ and a co-solvent, said co-solvent comprising an alkoxy substituent in the form of $R-O-R_1$, where R is an organic group and $O-R_1$ is said alkoxy substituent, $R_1$ is different from R, said alkoxy substituent forming Si-alkoxy (Si—$O-R_1$) bonds in the IMD layer; wherein said super critical fluid treatment further comprises adding a copper corrosion inhibitor.

15. The method of claim 14, wherein the alkoxy substituent is a methoxy substituent to form Si—$OCH_3$ bonds.

16. The method of claim 14, wherein the low-K IMD layer comprises an: interconnecting porous structure.

17. The method of claim 14, wherein the low-K IMD layer is selected from the group consisting of carbon doped silicon oxide, organo-silicate glass, and spin-on dielectrics.

18. The method of claim 14, further comprising the step of forming an etch stop layer on the low-K IMD layer following the supercritical fluid treatment.

19. The method of claim 14, wherein the low-K IMD layer comprises a plasma etched opening.

20. The method of claim 19, wherein the plasma etched opening is selected from the group consisting of a via and a dual damascene opening.

21. The method of claim 19, wherein the plasma etched opening is exposed to a plasma ashing process prior to the supercritical fluid treatment.

22. The method of claim 14, wherein the low-K IMD layer comprises an exposed copper portion.

23. The method of claim 14, wherein the copper corrosion inhibitor is selected from the group consisting of benzotriazole (BTA) and mercaptobenzothiazole (MBT).

24. The method of claim 14, further comprising the steps of:
  forming an etch s top layer on the on the low-K IMD layer;
  forming a plasma etched opening in the low-K IMD layer; and,
  carrying out the supercritical fluid treatment a second time.

25. The method of claim 24, further comprising the steps of;
  forming a barrier layer to line the plasma etched opening;
  backfilling the plasma etched opening with copper according;
  carrying out a CMP process to expose the low-K IMD layer; and,
  carrying out-the supercritical fluid treatment a third time.

26. A method for treating a low-K dielectric layer comprising the steps of: providing a low-K silicon oxide containing dielectric insulating layer; and carrying out a super critical fluid treatment of the plasma etched opening comprising supercritical $CO_2$ and an alkoxy containing co-solvent, said co-solvent comprising a methoxy substituent in the form of R—O—$R_1$, where R is an organic group and O—$R_1$ is said methoxy substituent, $R_1$ is different from R, said methoxy substituent forming Si-methoxy (Si—O—$R_1$) bonds in the low-K silicon oxide containing dielectric insulating layer; wherein said super critical fluid treatment further comprises adding a copper corrosion inhibitor.

27. The method of claim 26, wherein R is selected from the group consisting of alkyls, hydroxyalkyls, phenyls, alkylphenyls, hydroxyalkylphenyls, alkanols, and amines.

28. The method of claim 26, wherein the low-K dielectric insulating layer comprises an interconnecting porous structure.

29. The method of claim 26, wherein the low-K dielectric insulating layer is selected from the group consisting of carbon doped silicon oxide, organo-silicate glass, and spin-on dielectrics.

30. The method of claim 26, wherein the low-K dielectric insulating layer comprises an etched opening.

* * * * *